(12) United States Patent
Shizawa et al.

(10) Patent No.: US 8,558,616 B2
(45) Date of Patent: Oct. 15, 2013

(54) AMPLIFYING APPARATUS

(75) Inventors: Yoshinobu Shizawa, Kawasaki (JP);
Hiroaki Maeda, Kawasaki (JP);
Yousuke Okazaki, Kawasaki (JP);
Hirotake Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 13/234,285

(22) Filed: Sep. 16, 2011

(65) Prior Publication Data

US 2012/0126898 A1    May 24, 2012

(30) Foreign Application Priority Data

Nov. 22, 2010    (JP) .................... 2010-259700

(51) Int. Cl.
*H03F 1/26*    (2006.01)
*H03G 3/20*    (2006.01)
*H03F 1/32*    (2006.01)

(52) U.S. Cl.
CPC .................. *H03F 1/3247* (2013.01)
USPC .......................................... 330/149; 330/136

(58) Field of Classification Search
USPC ......... 330/136, 149; 455/114.3; 375/296–297
See application file for complete search history.

(56) References Cited

U.S. PATENT DOCUMENTS

| | | | |
|---|---|---|---|
| 5,276,921 A | 1/1994 | Kosugi | |
| 6,043,707 A * | 3/2000 | Budnik | 330/10 |
| 7,535,310 B2 | 5/2009 | Shimizu et al. | |
| 7,684,514 B2 | 3/2010 | Saito et al. | |
| 7,734,263 B2 | 6/2010 | Maeda et al. | |
| 7,957,710 B2 | 6/2011 | Kawamoto et al. | |
| 2008/0068191 A1 | 3/2008 | Maeda et al. | |

FOREIGN PATENT DOCUMENTS

| | | |
|---|---|---|
| JP | 2834304 B | 12/1998 |
| JP | 2003-8360 A | 1/2003 |
| JP | 2003-526980 A | 9/2003 |
| JP | 2005-244935 A | 9/2005 |
| JP | 2006-197537 A | 7/2006 |
| JP | 2008-78702 A | 4/2008 |
| JP | 2009-16999 A | 1/2009 |
| JP | 2010-226190 A | 10/2010 |
| WO | WO-01/67593 | 9/2001 |
| WO | WO-2007/148753 | 12/2007 |

\* cited by examiner

*Primary Examiner* — Robert Pascal
*Assistant Examiner* — Khiem Nguyen
(74) *Attorney, Agent, or Firm* — Fujitsu Patent Center

(57) ABSTRACT

An amplifying apparatus includes a first amplifier that amplifies an input signal on the basis of a value of a drain voltage and outputs a transmission signal, a distortion compensator that corrects a power amplitude of the input signal on the basis of a difference in power amplitude between the input signal and the transmission signal outputted from the first amplifier, a drain voltage controller that generates the drain voltage on the basis of the power amplitude of the input signal to be corrected, and a drain voltage corrector that corrects the drain voltage on the basis of the difference.

3 Claims, 7 Drawing Sheets

FIG. 6A

| POWER AMPLITUDE | ADDRESS VALUE | CONTROL COEFFICIENT |
|---|---|---|
| $p_0$ | 0 | $vds(p_0)$ |
| $p_1$ | 1 | $vds(p_1)$ |
| $p_2$ | 2 | $vds(p_2)$ |
| ⋮ | ⋮ | ⋮ |
| $p_{1023}$ | 1023 | $vds(p_{1023})$ |

FIG. 6B

| POWER AMPLITUDE | ADDRESS VALUE | COMPENSATION COEFFICIENT |
|---|---|---|
| $p_0$ | 0 | $h(p_0)$ |
| $p_1$ | 1 | $h(p_1)$ |
| $p_2$ | 2 | $h(p_2)$ |
| ⋮ | ⋮ | ⋮ |
| $p_{1023}$ | 1023 | $h(p_{1023})$ |

FIG. 6C

| POWER AMPLITUDE | ADDRESS VALUE | CORRECTION COEFFICIENT |
|---|---|---|
| $p_0$ | 0 | $hv(p_0)$ |
| $p_1$ | 1 | $hv(p_1)$ |
| $p_2$ | 2 | $hv(p_2)$ |
| ⋮ | ⋮ | ⋮ |
| $p_{1023}$ | 1023 | $hv(p_{1023})$ |

AMPLIFYING APPARATUS

CROSS-REFERENCE TO RELATED APPLICATION

This application is based upon and claims the benefit of priority of the prior Japanese Patent Application No. 2010-259700 filed on Nov. 22, 2010, the entire contents of which are incorporated herein by reference.

FIELD

The embodiments discussed herein are related to an amplifying apparatus that includes an amplifier that amplifies a transmission signal in a wireless communication system.

BACKGROUND

A wireless transmission apparatus includes an amplifying apparatus that amplifies a signal for transmission from an antenna. The performance of the amplifying apparatus is primarily evaluated on the basis of efficiency and linearity. The efficiency and linearity of the amplifying apparatus are determined by the characteristic of a power amplifier that inputs a power-amplified signal to the antenna. A power amplifier that provides higher efficiency consumes less power. A power amplifier that provides higher linearity linearly amplifies input signals of a wider power range, from small power ones to large power ones.

Power amplifiers currently employed in amplifying apparatuses include what is known as a class-A amplifier. The class-A amplifier produces small distortion and provides high linearity. On the other hand, the class-A amplifier constantly consumes power incidental to a DC bias current, and hence the efficiency is low.

One of the methods of improving the efficiency of the power amplifier is adjusting a drain voltage in accordance with the amplitude of the input signal, on the basis of a transistor characteristic that the efficiency becomes high in a saturation region. Accordingly, the amplifying apparatus includes a drain voltage controller that controls the drain voltage in accordance with the input signal amplitude.

Controlling the drain voltage in accordance with the input signal amplitude enables the efficiency of the power amplifier to be improved. However, adjusting the drain voltage in accordance with the input signal amplitude so as to improve the efficiency makes the transistor operate close to the saturation region, which leads to increased non-linearity of a gain of the power amplifier. The increase in non-linearity of the gain creates a distortion in an output waveform, because of fluctuation of the gain depending on the inputted power. Such a distortion originating from the non-linearity of the gain is called a non-linear distortion.

To compensate for the non-linear distortion of the power amplifier, the amplifying apparatus includes a distortion compensator. The distortion compensator detects the non-linear distortion generated in the power amplifier on the basis of a difference between a value of a part of the output signal of the power amplifier fed back to the input side and the input signal. The distortion compensator corrects the power amplitude of the input signal on the basis of the non-linear distortion thus detected so as to compensate for the non-linear distortion of the power amplifier, thereby linearizing the characteristic of the power amplifier.

Techniques related to an amplifying apparatus including a drain voltage controller and/or a distortion compensator can be found, for example, in Japanese Laid-open Patent Publications No. 2008-78702, No. 2003-8360, No. 2003-526980, No. 2009-16999, and No. 2005-244935.

In the power amplifier, a non-linear distortion of an output signal that depends on an input signal of a different timing from the timing of the respective input signals is generated, in addition to the foregoing static non-linear distortion. Such a dynamic non-linear distortion of the amplifier arises from a memory effect of the amplifier. The amplifier is composed of transistors. The dynamic non-linear distortion is generated by a parasitic capacitance component and a parasitic inductance component present in a bias circuit between the transistor and the drain voltage Vds. In a circuit where the drain voltage Vds is fixed, a part that reduces a low-frequency impedance can be mounted in the bias circuit, and hence the dynamic non-linear distortion can be suppressed. In contrast, in the case of adjusting the drain voltage Vds, the part for reducing the low-frequency impedance cannot be provided between the amplifier and the drain voltage controller. Accordingly, the parasitic capacitance component and the parasitic inductance component increase in the bias circuit, resulting in an increase in dynamic non-linear distortion. The parasitic capacitance component and the parasitic inductance component present in the circuits of the drain voltage controller also act to increase the dynamic non-linear distortion. For such reasons, a timing for adjusting the drain voltage with respect to an input signal is shifted when performing the adjustment of the drain voltage. Such a shift of the timing is called the memory effect. The extent of the non-linear distortion due to the memory effect dynamically fluctuates, and therefore the non-linear distortion due to the memory effect remains in the output signal of the power amplifier, although the static non-linear distortion can be compensated for by the foregoing distortion compensator.

SUMMARY

According to an aspect of the embodiment, an amplifying apparatus includes: a first amplifier that amplifies an input signal on the basis of a value of a drain voltage and outputs a transmission signal; a distortion compensator that corrects a power amplitude of the input signal on the basis of a difference in power amplitude between the input signal and the transmission signal outputted from the first amplifier; a drain voltage controller that generates the drain voltage on the basis of the power amplitude of the input signal to be corrected; and a drain voltage corrector that corrects the drain voltage on the basis of the difference.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A, 6B and 6C are examples of a lookup table; and

DESCRIPTION OF EMBODIMENTS

Hereafter, embodiments of the present invention will be described. Any combination of constituents and configurations according to the respective embodiment will be included in the scope of the present invention.

Figure 1:
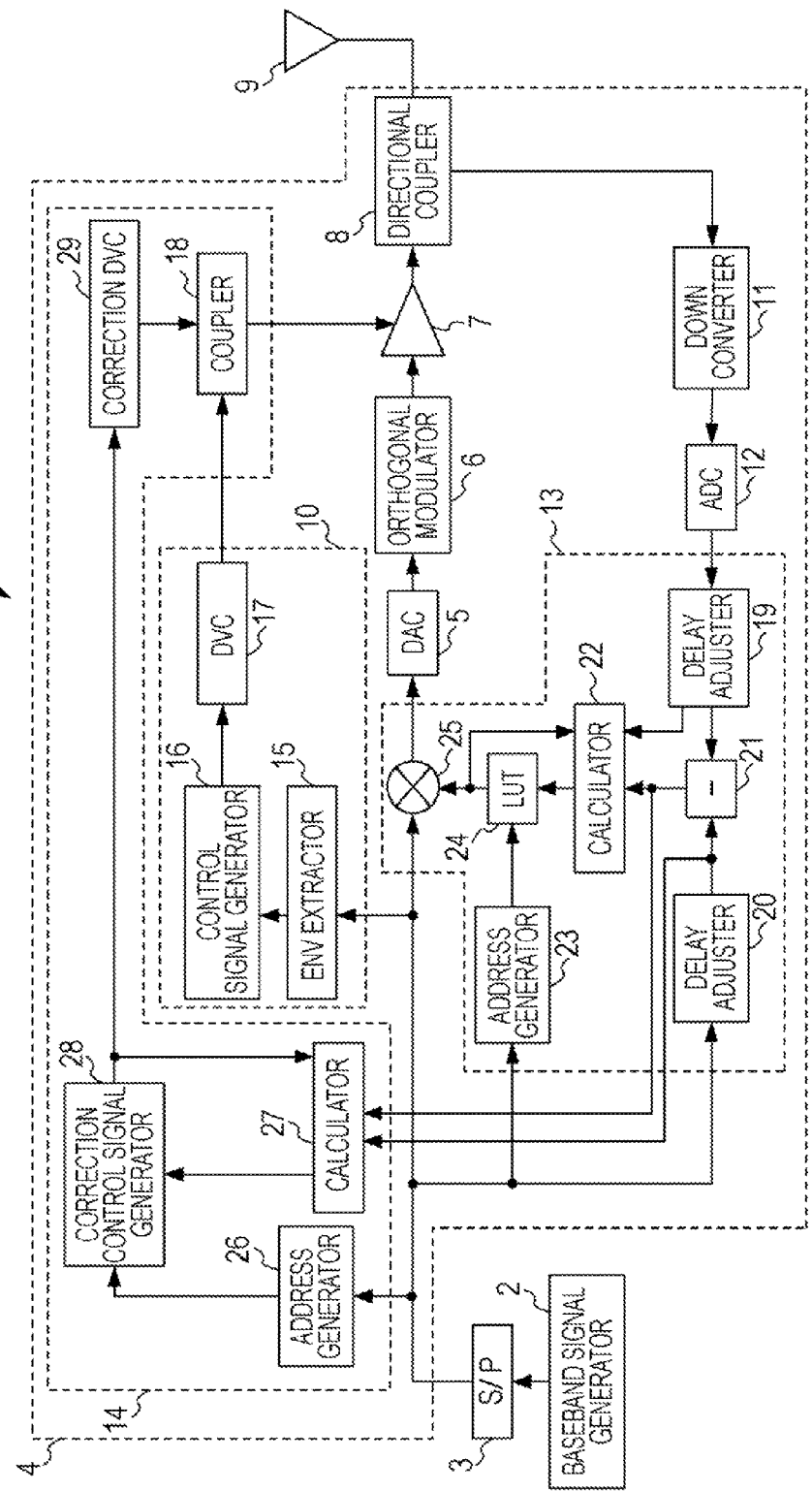
FIG. 1 is a block diagram of a transmission apparatus including an amplifying apparatus.

FIG. 1 is a block diagram of a transmission apparatus 1, exemplifying a transmission apparatus including an amplifying apparatus. The transmission apparatus 1 includes a baseband signal generator 2, a serial/parallel (hereinafter, S/P) converter 3, an amplifying apparatus 4, and an antenna 9.

The baseband signal generator 2 outputs an I signal and a Q signal which are baseband signals. The I signal and the Q signal are both a digital signal. The S/P converter 3 converts a serial baseband signal inputted thereto into a parallel signal composed of the I signal and the Q signal, and outputs the parallel signal. The amplifying apparatus 4 amplifies and modulates the I signal and the Q signal inputted thereto, and amplifies and outputs the processed signals. The antenna 9 wirelessly transmits the amplified signals outputted from the amplifying apparatus 4.

The amplifying apparatus 4 includes a drain voltage controller 10, a distortion compensator 13, a digital/analog converter (hereinafter, DAC) 5, an orthogonal modulator 6, a power amplifier 7, a directional coupler 8, a down converter 11, an analog/digital converter (hereinafter, ADC) 12, and a drain voltage corrector 14.

The drain voltage controller 10 controls a drain voltage of the power amplifier 7 on the basis of the power amplitude of an input signal to be inputted to the distortion compensator 13. Detail of the drain voltage controller 10 will be subsequently described.

The distortion compensator 13 multiplies the I signal and the Q signal by a compensation coefficient, to thereby compensate for the non-linearity of the power amplifier 7. The DAC 5 converts the I signal and the Q signal, which are digital signals that have undergone the distortion compensation, into analog signals. The orthogonal modulator 6 orthogonally modulates the I signal and the Q signal converted into analog signals, and outputs these signals. The orthogonal modulator 6 also performs an up-conversion of the frequency of the input signal upon performing the orthogonal modulation. The power amplifier 7 exemplifies the first amplifier of the present invention that amplifies a signal outputted from the orthogonal modulator 6 on the basis of a value of the drain voltage and outputs a transmission signal. The antenna 9 emits the amplified transmission signal in the form of a radio wave. Details regarding the distortion compensator 13 will be subsequently described.

The directional coupler 8 outputs a part of the transmission signal outputted by the power amplifier 7 to the down converter 11. The part of the transmission signal separated by the directional coupler 8 is fed back to the distortion compensator 13 that compensates for the distortion of the power amplifier 7. It is preferable to set the amplitude of the signal to be fed back such that the amplitude becomes equal to the amplitude of the unamplified signal taking the gain of the power amplifier 7 into account. Setting the amplitude of the feedback signal to be equal to the amplitude before the amplification allows a difference value that would be attained upon accurately performing the distortion compensation to be zero, in the calculation of the difference prior to the distortion compensation. Such an arrangement that makes the difference zero facilitates evaluation of the distortion compensation.

The down converter 11 performs a down conversion of the separated part of the transmission signal, such that the frequency of the transmission signal is converted to the frequency before the up-conversion by the orthogonal modulator 6. The ADC 12 converts the transmission signal, which is an analog signal, to a digital signal and generates a feedback signal. The generated feedback signal is converted into a feedback signal corresponding to the input signal (I signal and Q signal) in a predetermined circuit of the distortion compensator 13. The converted feedback signal is used for generating the compensation coefficient in the distortion compensator 13.

The drain voltage corrector 14 corrects the drain voltage to be supplied to the power amplifier 7 in order to correct the dynamic non-linearity arising from the memory effect, which is difficult to compensate for by using the distortion compensator 13. Details regarding the drain voltage corrector 14 will be subsequently described. Hereunder, detailed description on the drain voltage controller 10, the distortion compensator 13, and the drain voltage corrector 14 will be given.

The drain voltage controller 10 includes an envelope (hereinafter, ENV) extractor 15, a control signal generator 16, and a drain voltage controller (hereinafter, DVC) 17.

The ENV extractor 15 calculates an envelope signal $|x(t)|^2$ of the input signal $x(t)$ before the distortion compensation, to thereby obtain a power amplitude $p_i$ of the input signal. The ENV extractor 15 quantifies the power amplitude $p_i$ and outputs an address value i. For example, the ENV extractor 15 quantifies the power amplitude $p_i$ as 8 bits, and outputs a digital value of 8 bits as the address value i.

The control signal generator 16 generates a Vds control signal for causing the DVC 17 to output a desired drain voltage Vds. The control signal generator 16 stores a Vds control coefficient corresponding to the address value outputted from the ENV extractor 15, to generate the Vds control signal. The control signal generator 16 selects the Vds control coefficient in accordance with the address value outputted from the ENV extractor 15, and outputs the selected coefficient as the Vds control signal.

FIGS. 6A to 6C are examples of a lookup table. FIG. 6A shows an example of a Vds lookup table indicating the address values based on the power amplitude and the Vds control coefficients corresponding to the respective address values. The Vds lookup table is stored in the control signal generator 16.

Referring to FIG. 6A, a column 50 contains the power amplitudes $p_i$ calculated by the ENV extractor 15. The power amplitude $p_i$ represents a value calculated on the basis of the input signal. A column 51 contains the address values i (i is an integer from 0 to 1023 in this embodiment) obtained by quantifying the power amplitude $p_i$ in the ENV extractor 15. The address value i is outputted from the ENV extractor 15. A column 52 contains the Vds control coefficients vds $(p_i)$ corresponding to the respective address values i. The Vds lookup table stored in the control signal generator 16 may only contain the address value i in the column 51 and the Vds control coefficients vds $(p_i)$ in the column 52. Here, FIG. 1 will again be referred to.

The DVC 17 generates the drain voltage on the basis of the Vds control signal outputted from the control signal generator 16. The DVC 17 includes a digital/analog converter that converts the Vds control signal outputted from the control signal generator 16 into an analog signal, and an amplifier that amplifies the Vds control signal converted into the analog signal and outputs the drain voltage Vds to be applied to a drain terminal of the power amplifier 7. The drain voltage Vds outputted from the DVC 17 is applied to the drain terminal of the power amplifier 7.

The amplifying apparatus 4 thus controls the drain voltage in accordance with the input signal amplitude, thereby enabling improvement of the efficiency of the power amplifier 7.

The distortion compensator 13 compensates for the non-linear distortion of the power amplifier 7 on the basis of the difference between the input signal and the feedback signal. The distortion compensator 13 includes delay adjusters 19, 20, a difference calculator 21, a calculation circuit 22, an address generator 23, a lookup table (hereinafter, LUT) 24, and a multiplier 25.

The delay adjusters 19, 20 adjust a timing such that the feedback signal and the input signal are inputted to the difference calculator 21 at the same time.

The difference calculator 21 calculates a difference between the input signal after the timing adjustment and the feedback signal after the timing adjustment corresponding to the input signal.

The calculation circuit 22 utilizes the difference calculated by the difference calculator 21 to newly calculate a compensation coefficient $h_{n+1}(p)$ for multiplying the input signal thereby, from the already obtained compensation coefficient $h_n(p)$. Here, n represents the number of repetitions and p represents the power amplitude of the input signal. The input signal x(t) contains the I signal and the Q signal. Accordingly, p can be calculated as $(I^2+Q^2)$, I representing the value of the I signal, and Q representing the value of the Q signal. The compensation coefficient $h_k(p)$ is repeatedly calculated in accordance with the difference between the input signal and the feedback signal, where k is an integer not smaller than 1. Hereafter, the compensation coefficient will be represented by $h_k(p)$. It should be noted that p may be calculated as $(I^2+Q^2)^{(1/2)}$, instead of $(I^2+Q^2)$.

Figure 2:
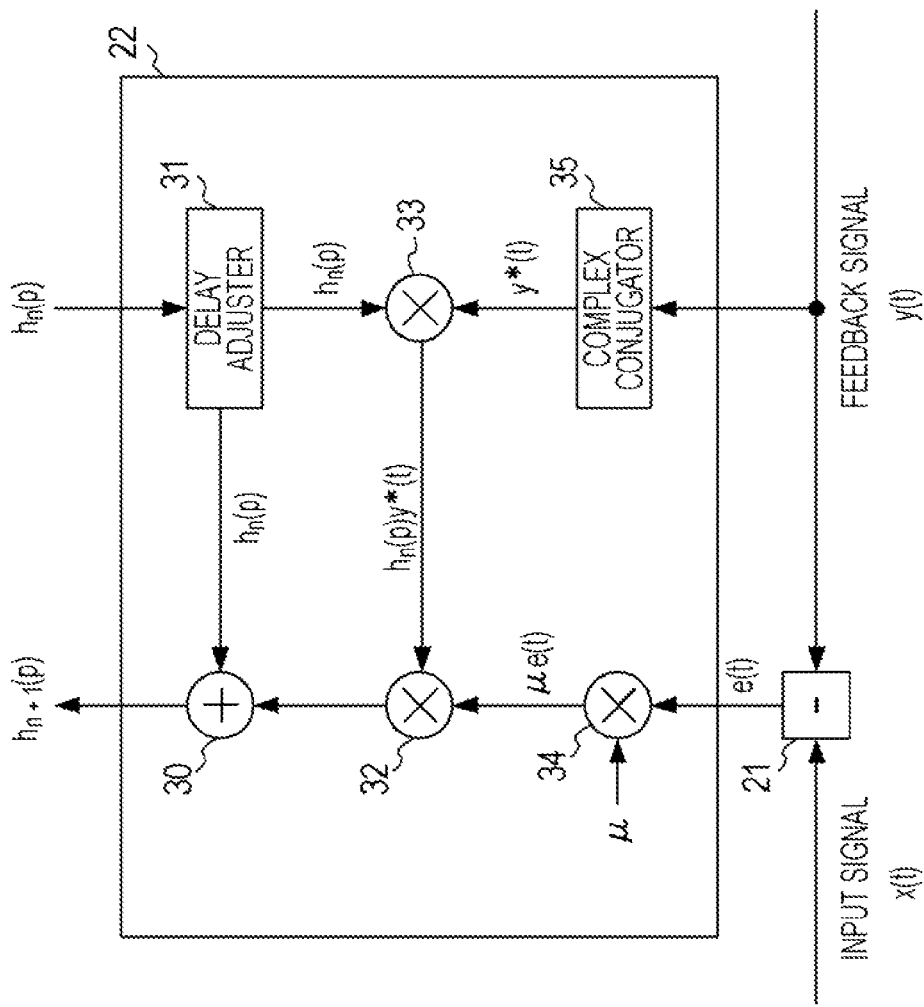
FIG. 2 is a detailed diagram of a calculation circuit in a distortion compensator.

FIG. 2 is a detailed diagram of the calculation circuit 22. The calculation circuit 22 calculates an (n+1)th compensation coefficient $h_{n+1}(p)$ from the already obtained n-th compensation coefficient $h_n(p)$. The calculation circuit 22 may employ, for example, signal adaptive processing based on a least-mean-square (LMS) algorithm, to calculate the compensation coefficient $h_{n+1}(p)$. The calculation circuit 22 includes an adder 30, multipliers 32, 33, 34, a delay adjuster 31, and a complex conjugator 35.

The multiplier 34 multiplies the difference e(t) between the input signal x(t) and the feedback signal y(t) by µ representing a step size parameter of an update amount, thus outputting µ·e(t). The delay adjuster 31 delays the already obtained n-th compensation coefficient $h_n(p)$ for a predetermined time, to thereby adjust the output timing such that a signal from the delay adjuster 31 and a signal from the multiplier 32 are simultaneously inputted to the adder 30. The complex conjugator 35 outputs y*(t) which is the complex conjugate of the feedback signal y(t). The multiplier 33 multiplies the compensation coefficient $h_n(p)$ after the delay adjustment and y*(t) which is the complex conjugate of the feedback signal, thus outputting $h_n(p) \cdot y^*(t)$. The multiplier 32 multiplies µ·e(t) and $h_n(p) \cdot y^*(t)$, thereby outputting $\mu \cdot e(t) \cdot h_n(p) \cdot y^*(t)$. The adder 30 sums $\mu \cdot e(t) \cdot h_n(p) \cdot y^*(t)$ and $h_n(p)$, and outputs the result as $h_{n+1}(p)$.

Here, FIG. 1 will again be referred to. The LUT 24 is a table containing the compensation coefficients h(p), representing the compensation coefficients $h_k(p)$ (k is an integer not smaller than 1) sequentially calculated and outputted by the calculation circuit 22, in association with the address value determined on the basis of the power amplitude p of the input signal. The LUT 24 outputs, upon receipt of an address signal from the address generator 23 to be subsequently described, the compensation coefficient h(p) corresponding to the received address signal to the multiplier 25.

The address generator 23 receives the input signal yet to be subjected to the distortion compensation. The address generator 23 generates the address signal on the basis of the power amplitude of the received input signal. The address signal may have, for example, an address value of 10 bits (an integer from 0 to 1023) determined in accordance with the level of the power amplitude p. The address generator 23 also includes a delay adjuster for outputting the address signal with a delay when updating the compensation coefficient $h_n(p)$ to the compensation coefficient $h_{n+1}(p)$ in the LUT 24.

FIG. 6B shows an example of a lookup table stored in the LUT 24. The lookup table contains the address values i (an integer from 0 to 1023 in this embodiment) corresponding to the power amplitude $p_i$ obtained by quantifying the power amplitude p of the input signal, and the compensation coefficients $h(p_i)$ corresponding to the respective address values i.

In FIG. 6B, a column 53 contains quantified values $p_i$ of the power amplitude p of the input signal. A column 54 contains the address values i uniquely determined on the basis of the quantified values $p_i$ of the power amplitude p. A column 55 contains the compensation coefficients $h(p_i)$ calculated on the basis of the address values i. As stated above, the compensation coefficient $h(p_i)$ is updated to the value sequentially calculated by the calculation circuit 22.

Again, FIG. 1 will be referred to. The multiplier 25 multiplies the input signal x(t) by the compensation coefficient h(p). As already stated, the input signal x(t) contains the I signal and the Q signal. The compensation coefficient h(p) also has two values (real part and imaginary part) respectively corresponding to the I signal and the Q signal. The multiplier 25 is configured to perform multiplications related to these signals and values.

With the foregoing configuration, the distortion compensator 13 is capable of compensating the distortion of the amplifier such that the gain of the power amplifier 7 becomes constant irrespective of the power amplitude of the input signal.

The power amplifier 7 with the drain voltage controller 10 has, as stated above, not only the static non-linear distortion that can be compensated for by the distortion compensator 13, but also the dynamic non-linear distortion arising from the memory effect. To compensate for the dynamic non-linear distortion, the amplifying apparatus 4 includes the drain voltage corrector 14.

The drain voltage corrector 14 includes an address generator 26, a calculation circuit 27, a correction control signal generator 28, a correction DVC 29, and a coupler 18.

The calculation circuit 27 utilizes the difference e(t) calculated by the difference calculator 21 to newly calculate a correction coefficient $hv_{n+1}(p)$ for outputting the correction drain voltage, from the already obtained correction coefficient $hv_n(p)$. Here, n represents the number of repetitions and p represents the power amplitude of the input signal. The value of p can be calculated as $(I^2+Q^2)$, I representing the value of the I signal, and Q representing the value of the Q signal. The correction coefficient $hv_k(p)$ is repeatedly calculated in accordance with the difference between the input signal and the feedback signal, where k is an integer not smaller than 1. Hereafter, the correction coefficient will be represented by $hv_k(p)$. It should be noted that p may be calculated as $(I^2+Q^2)^{(1/2)}$, instead of $(I^2+Q^2)$.

Figure 3:
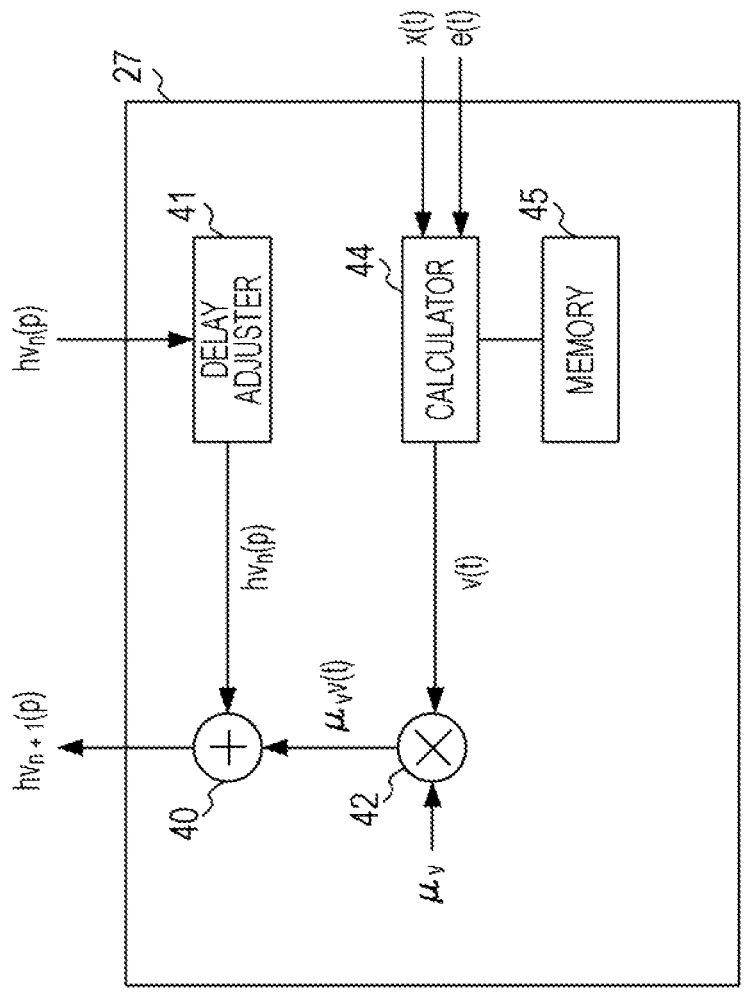
FIG. 3 is a detailed diagram of a calculation circuit in a drain voltage corrector.

FIG. 3 is a detailed diagram of the calculation circuit 27. The calculation circuit 27 calculates an (n+1)th correction coefficient $hv_{n+1}(p)$ from the already obtained n-th correction coefficient $hv_n(p)$. The calculation circuit 27 includes an adder 40, a multiplier 42, a delay adjuster 41, a calculator 44, and a memory 45.

The delay adjuster 41 delays the already obtained n-th correction coefficient $hv_n(p)$ for a predetermined time, to thereby adjust the calculation timing. The multiplier 42 multiplies $v(t)$ by $\mu_v$, representing a stepsize parameter of an update amount, thus outputting $\mu_v \cdot v(t)$. Here, $v(t)$ is a value outputted from the calculator 44.

The calculator 44 receives the input signal $x(t)$ and the difference $e(t)$. The calculator 44 calculates $v(t)$ on the basis of the received input signal $x(t)$ and the difference $e(t)$, as well as information stored in the memory 45, and outputs $v(t)$ to the multiplier 42. The memory 45 stores a table containing a relationship between the drain voltage Vds and the gain of the power amplifier 7, with respect to each power output Pout. The memory 45 also contains an ideal value iGain of the power amplifier 7 specified according to the design. The adder 40 sums $\mu_v \cdot v(t)$ and $hv_n(p)$, and outputs the result as $hv_{n+1}(p)$.

Figure 4:
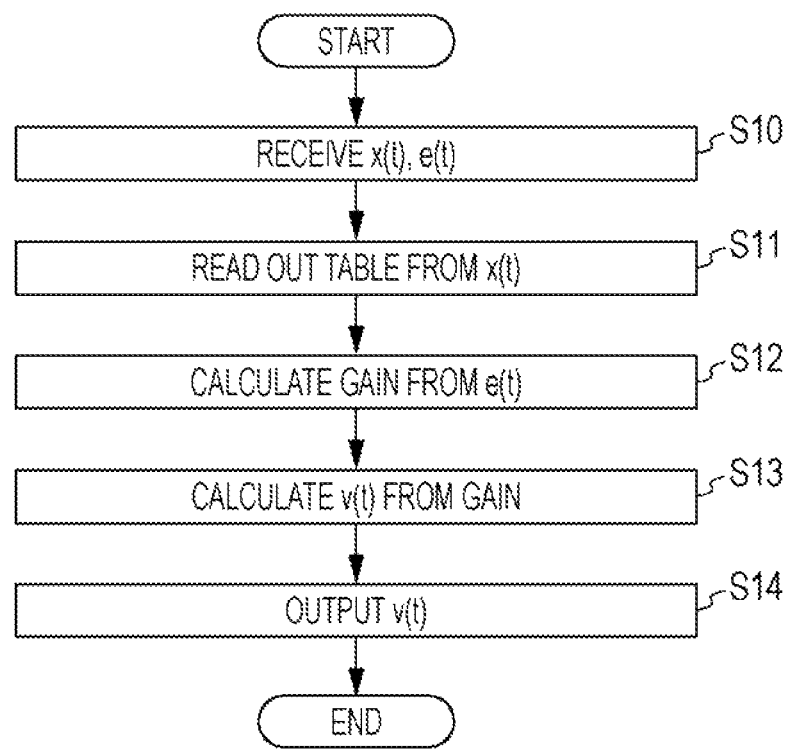
FIG. 4 is a flowchart showing an operation process of a calculator.

FIG. 4 is a flowchart showing the operation process of the calculator 44. Referring to FIG. 4, the operation of the calculator 44 will be described in detail.

The calculator 44 receives the input signal $x(t)$ that has undergone the delay adjustment by the delay adjuster 20 and the difference $e(t)$ between $x(t)$ and $y(t)$ outputted from the difference calculator 21 (step S10). The calculator 44 reads out the table showing the relationship between the drain voltage Vds and the gain from the memory 45, on the basis of the received $x(t)$ (step S11). The calculator 44 calculates the current gain of the power amplifier 7 on the basis of the difference $e(t)$ and the ideal value iGain stored in the memory 45 (step S12). The calculator 44 calculates the difference $v(t)$ between the drain voltage corresponding to iGain and the drain voltage corresponding to the current gain, on the basis of the calculated gain and the retrieved table (step S13). Then the calculator 44 outputs $v(t)$ thus calculated (step S14).

As above, the amplifying apparatus 4 calculates $v(t)$ with the calculator 44, and repeats the feedback calculations by the drain voltage corrector 14 such that $v(t)$ becomes zero. Such an arrangement can bring the gain of the power amplifier 7 close to the ideal value iGain.

Figure 5:
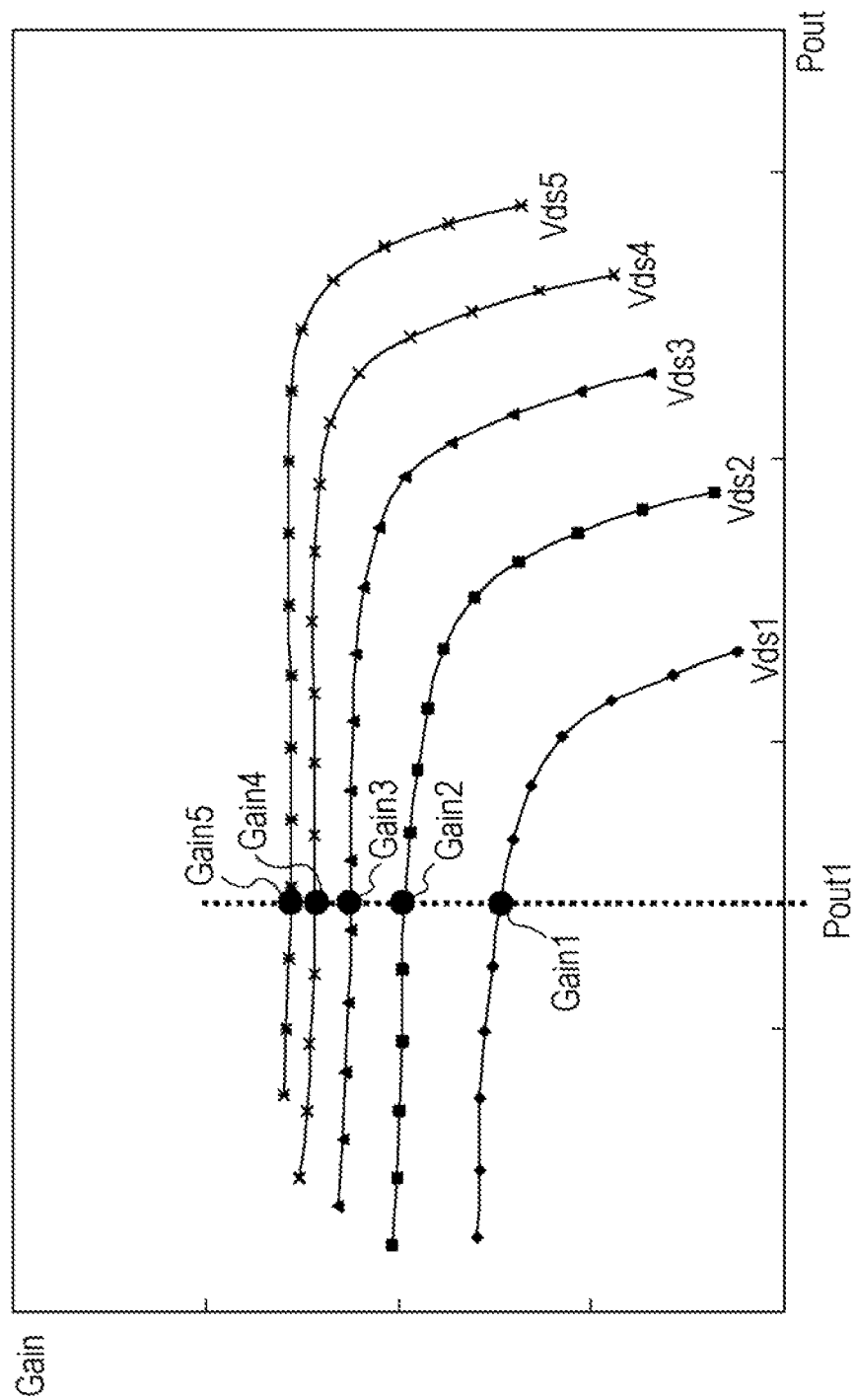
FIG. 5 is a graph showing relationships between a power output and a gain resulting from different drain voltages.

FIG. 5 is a graph showing relationships between a power output Pout and a Gain of the power amplifier 7, resulting from different drain voltages. Referring to FIG. 5, a process of determining parameters for the table stored in the memory 45 will be described.

In FIG. 5, lines Vds 1, Vds 2, Vds 3, Vds 4, and Vds 5 each represent a relationship between the power output Pout and the gain of the power amplifier 7, resulting from application of different drain voltages Vds 1, Vds 2, Vds 3, Vds 4, and Vds 5. In terms of the gain at the power output Pout1 corresponding to the respective drain voltages, the drain voltage Vds 1 results in Gain 1, the drain voltage Vds 2 results in Gain 2, the drain voltage Vds 3 results in Gain 3, the drain voltage Vds 4 results in Gain 4, and the drain voltage Vds 5 results in Gain 5. Accordingly, fixing the power output Pout enables the relationship between the drain voltage and the gain to be determined as shown in FIG. 5. The memory 45 in the calculation circuit 27 shown in FIG. 3 stores the relationship between the drain voltage Vds and the gain acquired with respect to different power outputs Pout, as the table information.

Although $x(t)$ and $e(t)$ are inputted to the calculator 44 of the calculation circuit 27 shown in FIG. 3 in this embodiment, only $e(t)$ may be inputted. In the case of inputting only $e(t)$, the calculator 44 may generate $v(t)$ through calculation on the basis of the inputted $e(t)$ and a reference stored in the memory 45. The calculation circuit 27 may then utilize the $v(t)$ thus generated to calculate the correction coefficient $hv_{n+1}(p)$.

Referring again to FIG. 1, the correction control signal generator 28 stores $hv_{n+1}(p)$ outputted from the calculation circuit 27 as the parameter for the lookup table. The lookup table stored in the correction control signal generator 28 will now be described, referring to FIG. 6C.

FIG. 6C shows an example of the lookup table stored in the LUT 24. The lookup table contains the address values i (an integer from 0 to 1023 in this embodiment) corresponding to the power amplitude $p_i$ obtained by quantifying the power amplitude p of the input signal, and the correction coefficient $hv(p_i)$ corresponding to the respective address values i.

In FIG. 6C, a column 56 contains quantified values $p_i$ of the power amplitude p of the input signal. A column 57 contains the address values i uniquely determined on the basis of the quantified values $p_i$ of the power amplitude p. A column 58 contains the correction coefficients $hv(p_i)$ calculated on the basis of the address values i. As stated above, the correction coefficient $hv(p_i)$ is updated to the value sequentially calculated by the calculation circuit 27.

Now, FIG. 1 will again be referred to. The address generator 26 receives the input signal yet to be subjected to the distortion compensation. The address generator 26 generates the address signal on the basis of the power amplitude of the received input signal. The address signal may have, for example, an address value of 10 bits (an integer from 0 to 1023) determined in accordance with the level of the power amplitude p. The address generator 26 also includes a delay adjuster for outputting the address signal with a delay when updating the correction coefficient $hv_n(p)$ to the correction coefficient $hv_{n+1}(p)$ in the correction control signal generator 28.

The correction control signal generator 28 receives the address value i outputted from the address generator 26. The correction control signal generator 28 then refers to the lookup table to thereby select the correction coefficient $hv(p_i)$ corresponding to the received address value i, and outputs the selected correction coefficient $hv(p_i)$.

The correction DVC 29 generates a correction drain voltage $\Delta$Vds on the basis of the correction coefficient $hv(p_i)$ outputted from the correction control signal generator 28. The correction DVC 29 includes a digital/analog converter that converts the correction coefficient $hv(p_i)$ outputted from the correction control signal generator 28 into an analog signal, and an amplifier that amplifies the correction coefficient converted into the analog signal and outputs the correction drain voltage $\Delta$Vds. The amplifier of the correction DVC 29 exemplifies the second amplifier of the present invention. The correction drain voltage $\Delta$Vds is a value used for correction of the drain voltage Vds to be applied to the drain terminal of the power amplifier 7. The correction drain voltage $\Delta$Vds outputted from the correction DVC 29 is inputted to the coupler 18. The coupler 18 sums the drain voltage Vds and the correction drain voltage $\Delta$Vds, thereby outputting a resulting corrected drain voltage.

The power amplifier 7 is an amplifier that outputs a large power. The larger the power output is, the larger the transistor constituting the amplifier has to be. An increase in the size of the transistor may lead to an increase in the parasitic capacitance of the transistor. The larger the parasitic capacitance and parasitic inductance of the drain bias line are, the slower the response of an output signal becomes to an input signal. Such a delay in the response appears as the memory effect of the amplifier.

The timing shift between the input signal and the output signal creates a fluctuation in the gain of the power amplifier 7. The fluctuation in the gain of the power amplifier 7 arising from the memory effect is small compared with the gain of the power amplifier 7. The gain of the power amplifier 7 changes depending on the drain voltage. Accordingly, the gain of the amplifier of the correction DVC 29 that serves to correct the fluctuation in the gain of the power amplifier 7 may be smaller than the gain of the amplifier of the DVC 17 that generates the drain voltage. A smaller gain of the amplifier leads to a reduced memory effect. Reducing the gain of the correction DVC 29 allows, therefore, the fluctuation in the amplitude of the power amplifier 7 arising from the memory effect to be accurately corrected.

The coupler 18 adds the correction drain voltage $\Delta Vds$ outputted from the correction DVC 29 to the drain voltage Vds outputted from the DVC 17, and outputs the corrected drain voltage ($Vds+\Delta Vds$) as the drain voltage of the power amplifier 7.

Thus, the amplifying apparatus 4 can compensate for the dynamic non-linear distortion of the power amplifier 7 by correcting the drain voltage on the basis of the difference between the input signal before the distortion compensation and the input signal after the distortion compensation.

The drain voltage corrector 14 may be configured to start the correction process after the difference value outputted from the difference calculator 21 becomes smaller than a predetermined threshold. The distortion compensator 13 repeats the distortion compensation process so as to make the difference value outputted from the difference calculator 21 smaller. Accordingly, starting the drain voltage correction process after the difference value becomes smaller than the threshold allows a timing for the compensation of the static non-linear distortion and a timing for the compensation of the dynamic non-linear distortion to be shifted from each other. Such a shift in timing prevents either compensation process from acting as noise that affects the other compensation process, thereby improving the efficiency of the respective compensation process.

Figure 7A:
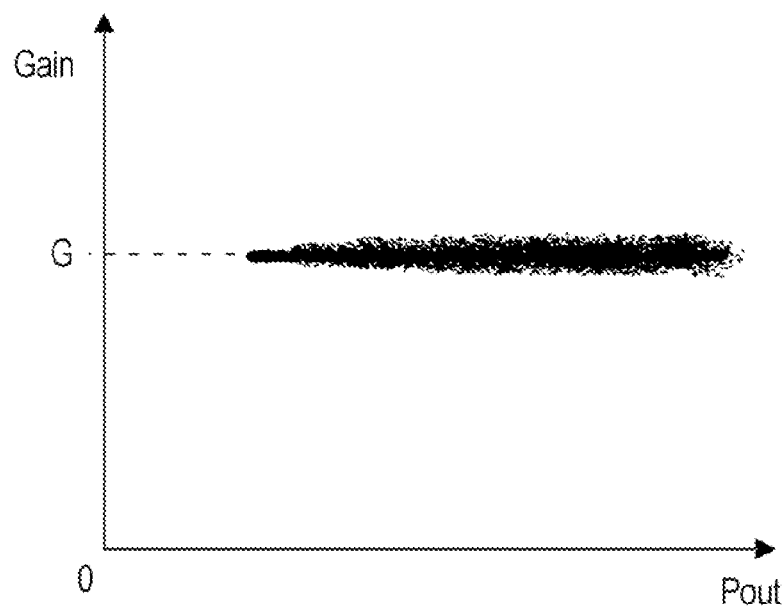
FIGS. 7A and 7B are graphs showing an effect of the present embodiment.
Figure 7B:
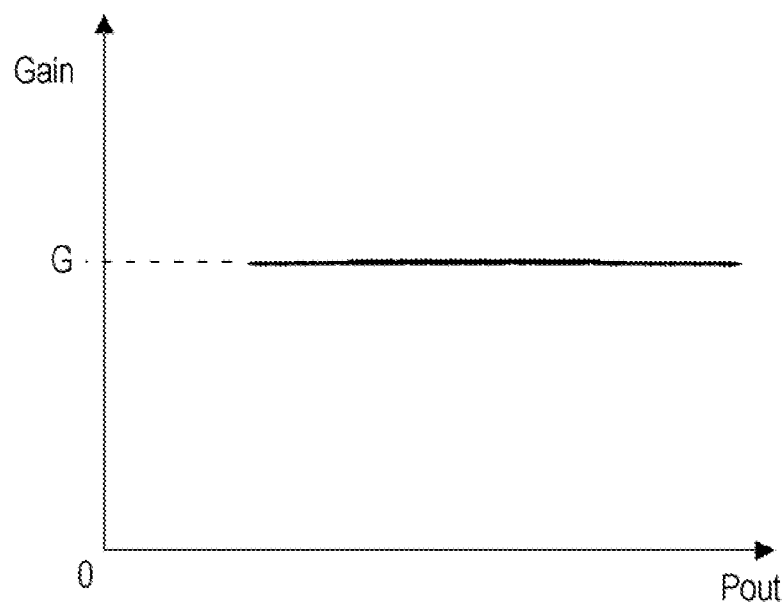

FIGS. 7A and 7B illustrate the effects obtained by the compensation of the dynamic non-linear distortion of the power amplifier 7 according to this embodiment. FIG. 7A shows a relationship between the power output Pout and the gain of the power amplifier 7, measured for a predetermined period of time before the compensation of the dynamic non-linear distortion. FIG. 7B shows a relationship between the power output Pout and the gain of the power amplifier 7, measured for a predetermined period of time after the compensation of the dynamic non-linear distortion.

From FIG. 7A, it is understood that the gain of the power amplifier 7 fluctuates about the gain G owing to the memory effect, before the compensation of the dynamic non-linear distortion. In contrast, FIG. 7B shows that the gain of the power amplifier 7 remains substantially constant at the gain G, as a result of the compensation of the dynamic non-linear distortion by correcting the drain voltage according to this embodiment.

Thus, the amplifying apparatus 4 can compensate for the dynamic non-linear distortion of the power amplifier 7 by correcting the drain voltage on the basis of the difference between the input signal before the distortion compensation and the input signal after the distortion compensation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An amplifying apparatus comprising:
    a first amplifier that amplifies an input signal based on a value of a drain voltage and outputs a transmission signal;
    a distortion compensator that corrects a power amplitude of the input signal based on a difference in power amplitude between the input signal and the transmission signal outputted from the first amplifier;
    a drain voltage controller that generates the drain voltage based on the power amplitude of the input signal to be corrected; and
    a drain voltage corrector that corrects the drain voltage based on the difference,
    wherein the drain voltage corrector includes:
        an address generator that outputs a power amplitude value of the input signal,
        a calculator that calculates a correction coefficient for correcting the drain voltage based on the difference,
        a correction control signal generator that stores the correction coefficient calculated by the calculator in association with the power amplitude value corresponding to the difference obtained at the time of calculation, and outputs the correction coefficient in accordance with the power amplitude value outputted from the address generator, and
        a second amplifier that amplifies the correction coefficient outputted from the correction control signal generator and generates a correction value for correcting the drain voltage.

2. The amplifying apparatus according to claim 1, wherein the drain voltage corrector starts to correct the drain voltage after distortion compensation is performed until the difference becomes smaller than a predetermined value.

3. The amplifying apparatus according to claim 1, wherein an amplification ratio of the second amplifier is smaller than an amplification ratio of the drain voltage controller.

* * * * *